United States Patent
Ooura et al.

(10) Patent No.: US 9,837,248 B2
(45) Date of Patent: Dec. 5, 2017

(54) ION IMPLANTATION APPARATUS AND METHOD OF CONTROLLING ION IMPLANTATION APPARATUS

(71) Applicant: Sumitomo Heavy Industries Ion Technology Co., Ltd., Tokyo (JP)

(72) Inventors: Masahide Ooura, Ehime (JP); Daisuke Imai, Ehime (JP); Shiro Ninomiya, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 141 days.

(21) Appl. No.: 14/605,404

(22) Filed: Jan. 26, 2015

(65) Prior Publication Data

US 2015/0214007 A1    Jul. 30, 2015

(30) Foreign Application Priority Data

Jan. 29, 2014 (JP) .................. 2014-014584

(51) Int. Cl.
*H01J 37/317* (2006.01)
*H01J 37/30* (2006.01)

(52) U.S. Cl.
CPC ...... *H01J 37/3171* (2013.01); *H01J 37/3002* (2013.01); *H01J 2237/0206* (2013.01); *H01J 2237/18* (2013.01); *H01J 2237/304* (2013.01); *H01J 2237/30472* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,207,027 | B1* | 3/2001 | Ngan | C23C 14/358 204/192.12 |
| 2008/0251713 | A1* | 10/2008 | Tsukihara | H01J 37/045 250/282 |
| 2008/0251737 | A1 | 10/2008 | Tsukihara et al. | |
| 2013/0256566 | A1* | 10/2013 | Kariya | H01L 21/67213 250/492.21 |

FOREIGN PATENT DOCUMENTS

| | | |
|---|---|---|
| JP | H02-230651 A | 9/1990 |
| JP | H04-336421 A | 11/1992 |
| JP | H06-036738 A | 2/1994 |
| JP | 2008-262748 A | 10/2008 |
| JP | 2008-262756 A | 10/2008 |

* cited by examiner

*Primary Examiner* — Phillip A Johnston
*Assistant Examiner* — Hsien Tsai
(74) *Attorney, Agent, or Firm* — Michael Best & Friedrich LLP

(57) ABSTRACT

In an ion implantation apparatus, an interruption member interrupts an ion beam B in the middle of a beam line. A plasma shower device is provided at the downstream side of the interruption member in the beam line. A control unit causes the interruption member to interrupt the ion beam B during an ignition start period of the plasma shower device. The interruption member may be provided at the upstream side of at least one high-voltage electric field type electrode in the beam line. A gas supply unit may supply a source gas to the plasma shower device. The control unit may start the supply of the source gas from the gas supply unit after the ion beam B is interrupted by the interruption member.

12 Claims, 6 Drawing Sheets

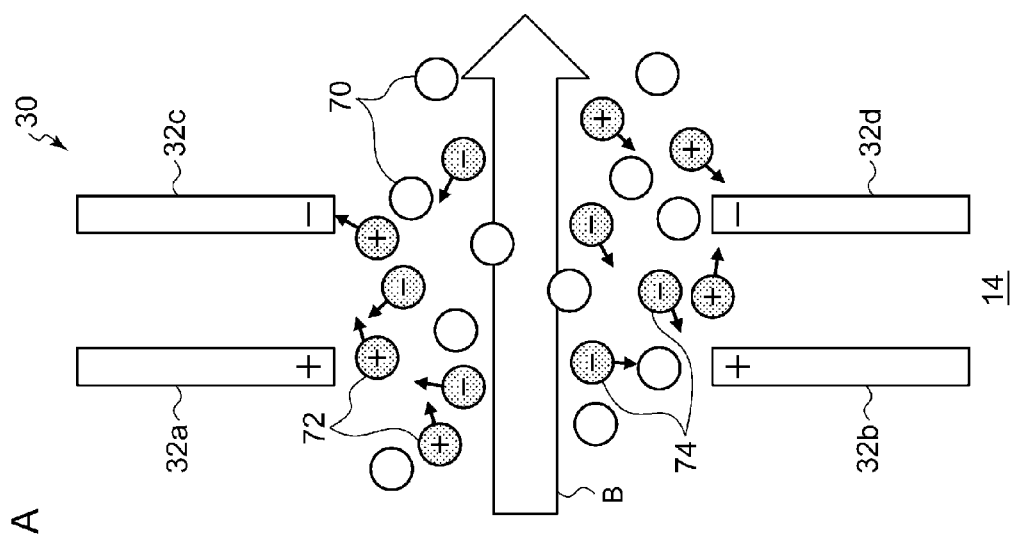
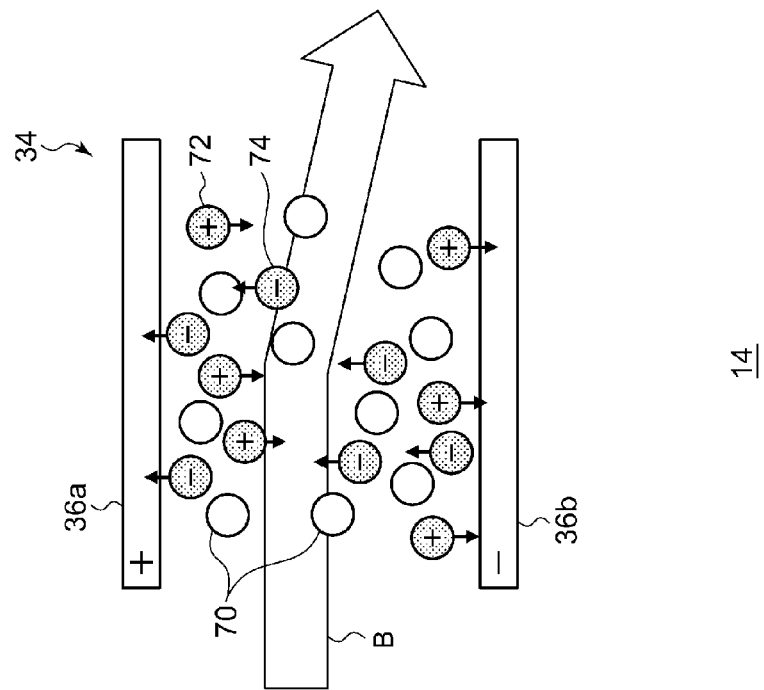

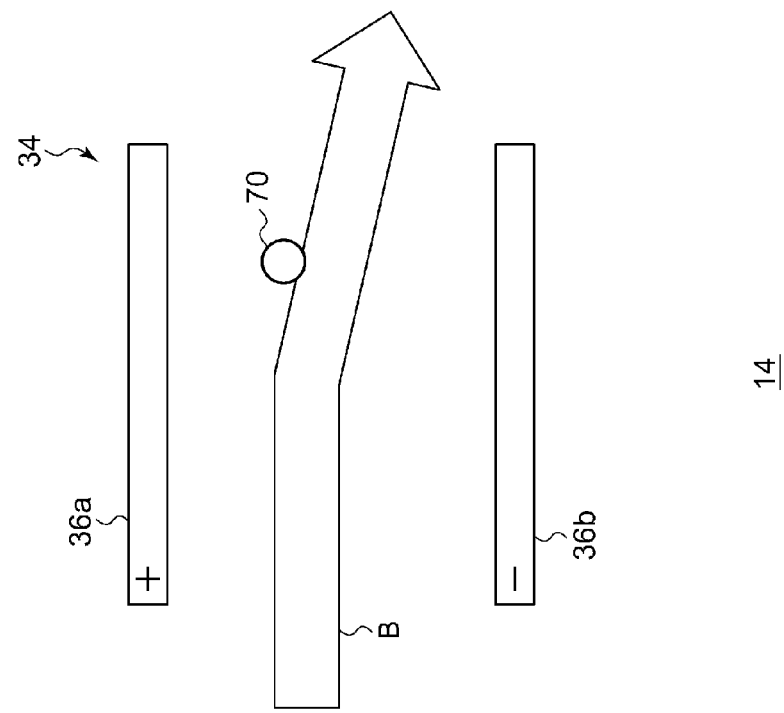
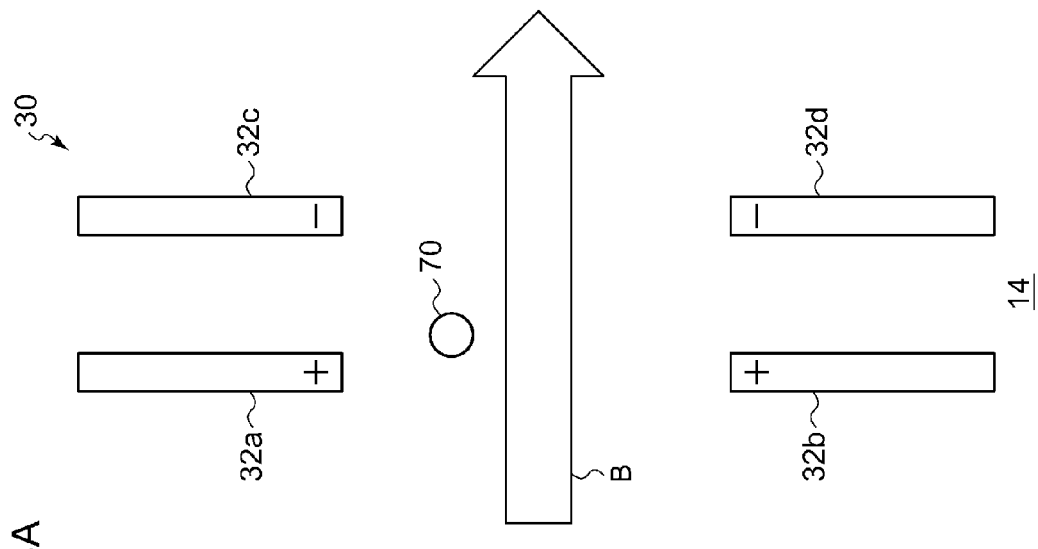

ION IMPLANTATION APPARATUS AND METHOD OF CONTROLLING ION IMPLANTATION APPARATUS

BACKGROUND OF THE INVENTION

1. Field of the Invention

The present invention relates to an ion implantation apparatus and a method of controlling the ion implantation apparatus.

2. Description of the Related Art

In a semiconductor production process, a step of implanting ions to a semiconductor wafer (hereinafter, referred to as an "ion implantation step") is generally performed for the purpose of changing the conductivity and the crystalline structure of the semiconductor wafer. An apparatus that is used in the ion implantation step is called an ion implantation apparatus, and has a function of forming an ion beam ionized by an ion source and accelerated and a function of carrying the ion beam to an implantation processing chamber and irradiating the ion beam to a wafer inside the processing chamber.

The ion implantation apparatus has a configuration in which, for example, an ion source, a drawn electrode, a mass-spectrometry magnet, a mass-spectrometry slit, an acceleration/deceleration device, a wafer processing chamber, and the like are disposed along the beam line and ions are implanted into a wafer as a semiconductor substrate. These devices control the ion beam by using an electric field formed between the electrodes to which a voltage is applied or a magnetic field generated by the magnet.

Further, the implantation processing chamber is provided with a plasma generation device that prevents the wafer surface from being charged by the implantation of the ions. The plasma generation device neutralizes the charges charged to the wafer surface by supplying plasma to the wafer surface. As such a plasma generation device, for example, a discharging mechanism that generates plasma by causing a discharge in the introduced source gas is provided inside the implantation processing chamber.

The plasma generation device needs a small amount of the quantitative source gas for generating the plasma during the plasma shower action. Particularly, since a large amount of the source gas is introduced during the plasma ignition period compared to the case of the plasma shower action, the vacuum degree of the implantation processing chamber is degraded, and a large amount of the source gas also partially flows into the beam line connected to the implantation processing chamber. When the ion beam having acceleration energy collides with the source gas while the ion beam is carried along the beam line, the source gas is ionized, so that charged particles are generated. For this reason, the charged particles are generated in the middle of the beam line into which a part of the source gas flows. Since the beam line is provided with an electrode to which a high voltage is applied, the generated charged particles flow into the electrode so that a load current is generated, and hence there is a concern that an overcurrent may be generated in a power supply connected to the electrode.

SUMMARY OF THE INVENTION

An illustrative object of an aspect of the present invention is to provide a technique of protecting a power supply from an overcurrent caused by the generation of a load current.

According to one aspect of the present invention, there is provided an ion implantation apparatus according to an aspect of the present invention, including: an interruption member that interrupts an ion beam in the middle of a beam line; a plasma shower device that is provided at the downstream side of the interruption member in the beam line; and a control unit that causes the interruption member to interrupt the ion beam during an ignition start period of the plasma shower device.

Another aspect of the invention is a method of controlling an ion implantation apparatus. The ion implantation apparatus forms a beam line carrying an ion beam drawn out from an ion source to an implantation processing chamber, and the ion implantation apparatus includes a plasma shower device that supplies electrons to the ion beam in the implantation processing chamber. The plasma shower device includes a plasma generation chamber that communicates with the implantation processing chamber, generates plasma by using a source gas introduced into the plasma generation chamber. This method comprises interrupting the ion beam in the middle of the beam line when the plasma shower device starts to generate the plasma.

Optional combinations of the aforementioned constituting elements, and implementations of the invention in the form of methods, apparatuses, and systems, may also be practiced as additional modes of the present invention.

BRIEF DESCRIPTION OF THE DRAWINGS

Embodiments will now be described, byway of example only, with reference to the accompanying drawings that are meant to be exemplary, not limiting, and wherein like elements are numbered alike in several figures, in which:

FIGS. 2A and 2B are schematic views illustrating an electrode state according to a comparative example;

FIGS. 4A and 4B are schematic views illustrating an electrode state in a high vacuum state;

DETAILED DESCRIPTION OF THE INVENTION

Figure 1A:
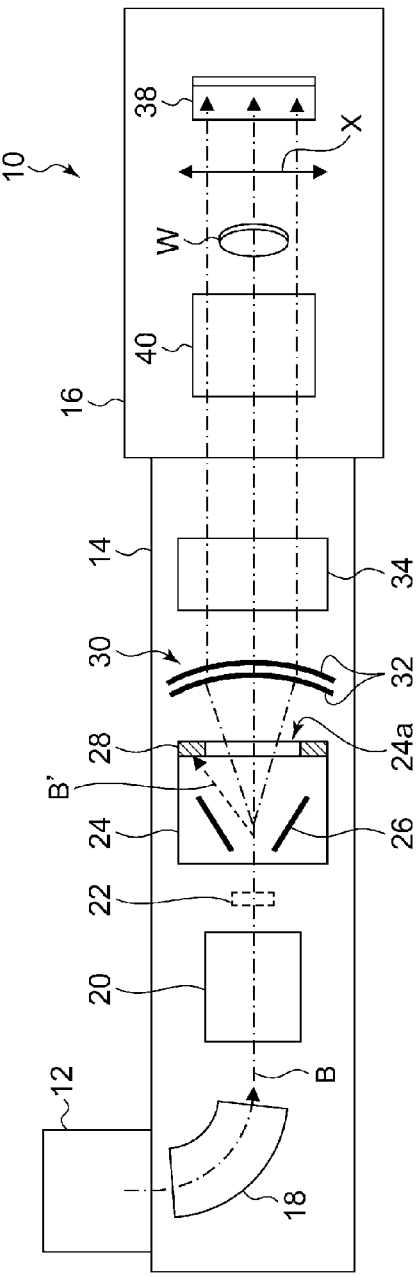
FIG. 1A is a top view illustrating a schematic configuration of an ion implantation apparatus according to an embodiment.

The invention will now be described by reference to the preferred embodiments. This does not intend to limit the scope of the present invention, but to exemplify the invention.

Hereinafter, embodiments of the present invention will be described in detail with reference to the drawings. The same reference sign will be assigned to the same element in the drawings, and duplicate description thereof will not be presented as is appropriate. The configurations described below are merely examples but are not for purposes of limiting the scope of the present invention.

The outline of the invention will be illustrated prior to the description of the embodiment. An ion implantation apparatus according to the embodiment includes a beam line device which forms a beam line carrying an ion beam drawn out from an ion source to an implantation processing chamber and a plasma shower device which supplies electrons to the ion beam in the implantation processing chamber. The plasma shower device requires a large amount of a source gas having a comparatively high concentration when plasma starts to be generated. For that reason, a large amount of the source gas which is introduced for the plasma ignition degrades the vacuum degree in the implantation processing chamber and the beam line device.

When the ion beam passes through the beam line device having a comparatively large amount of source gas molecules due to the degradation of the vacuum degree, the ion beam collides with the source gas molecules so as to be ionized, and hence charged particles (ions and electrons) are generated. Since the beam line device is provided with an electrode as a deflection member that deflects the ion beam by the action of an electric field, the charged particles which are generated by the ionization of the source gas molecules flow to the electrode to which a high voltage is applied, and hence a load current is generated. Therefore, an overcurrent flows to a power supply that applies a high voltage to the electrode.

Therefore, in the embodiment, the plasma shower device is provided inside the implantation processing chamber, and the ion beam is temporarily evacuated from the beam line when plasma starts to be generated in the plasma shower device of the implantation processing chamber in which the vacuum degree in the beam line device is degraded in the beam line device at the upstream side of the implantation processing chamber. Specifically, the interruption member provided on the beam line is operated so as to interrupt the ion beam at the upstream position of the electrode to which a high voltage is applied. Thus, the generation of the charged particles caused by the collision of the ion beam is suppressed at the downstream side of the beam line in which the vacuum degree is degraded. The plasma shower device may be activated while the beam line device is operated. Accordingly, it is possible to shorten the start-up time until the ion implantation processing may be performed.

Figure 1B:
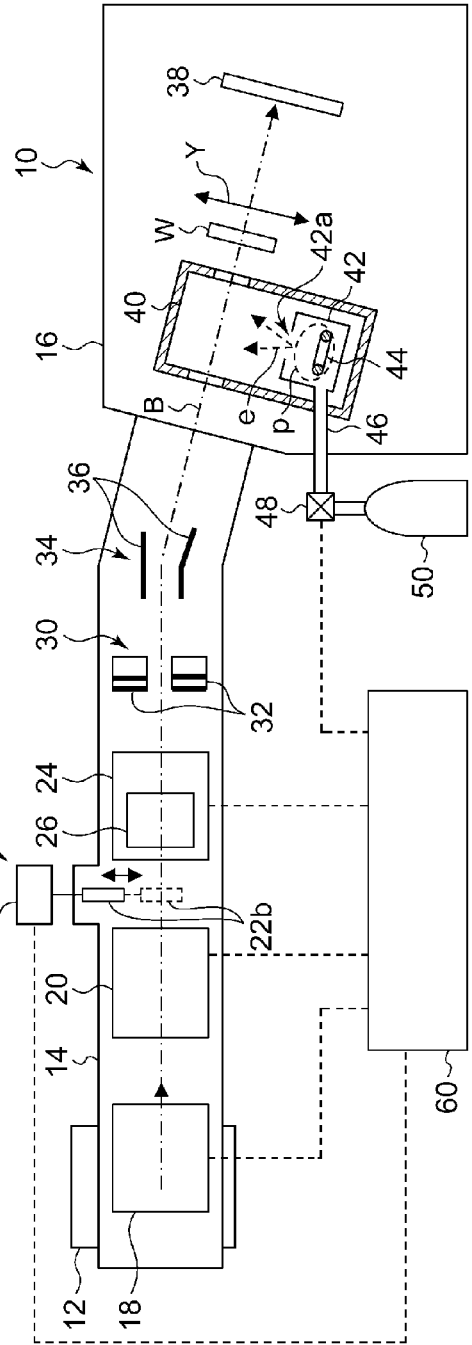
FIG. 1B is a side view illustrating a schematic configuration of the ion implantation apparatus according to the embodiment.

FIG. 1 is a schematic diagram that illustrates an ion implantation apparatus 10 according to an embodiment. FIG. 1A is a top view that illustrates a schematic configuration of the ion implantation apparatus 10, and FIG. 1B is a side view that illustrates a schematic configuration of the ion implantation apparatus 10.

The ion implantation apparatus 10 is configured to perform an ion implanting process for the surface of a processing object W. The processing object W, for example, is a substrate such as a semiconductor wafer. Thus, hereinafter, for the convenience of description, while the processing object W may be referred to as a substrate W, but it does not intent to limit the target of the implanting process to a specific object.

The ion implantation apparatus 10 is configured to emit an ion beam B over the entire substrate W through at least one of beam scanning and mechanical scanning. Here, for the convenience of description, the traveling direction of the ion beam B in the design is defined as a z direction, and a plane that is perpendicular to the z direction is defined as an xy plane. As will be described later, in a case where the processing object W is scanned using an ion beam B, the scanning direction is defined as an x direction, and a direction that is perpendicular to the z direction and the x direction is defined as a y direction. Accordingly, the beam scanning is performed in the x direction, and the mechanical scanning is performed in the y direction.

The ion implantation apparatus 10 includes an ion source 12, a beam line device 14, and an implantation processing chamber 16. The ion source 12 is configured to supply the ion beam B to the beam line device 14. The beam line device 14 is configured to transport ions from the ion source 12 to the implantation processing chamber 16. In addition, the ion implantation apparatus 10 includes a vacuum pumping system (not illustrated in the figure) that is used for providing a desired vacuum environment for the ion source 12, the beam line device 14, and the implantation processing chamber 16.

As illustrated in the drawings, a beam line device 14 includes, for example, a mass spectrometry unit 18, a beam shaping unit 20, a beam measurement unit 22, a beam scanner 24, a parallel lens 30 or a beam parallelizing device, and an AEF (Angular Energy Filter) 34 in this order from the upstream side. The upstream side of the beam line device 14 is close to an ion source 12, and the downstream side thereof is close to an implantation processing chamber 16 (or a beam stopper 38).

The mass spectrometry unit 18 is provided at the downstream side of the ion source 12, and is configured to select a necessary ion type from an ion beam B drawn out from the ion source 12 through mass spectrometry. The beam shaping unit 20 includes a convergence lens such as a quadrupole convergence device (Q lens), and is configured to shape the ion beam B into a desired cross-sectional shape.

The beam measurement unit 22 is an injector flag faraday cup which is disposed so as to move into and out of the beam line and measures the current of the ion beam. The beam measurement unit 22 includes a faraday cup 22b which measures a beam current and a drive unit 22a which moves the faraday cup 22b up and down. As indicated by the dashed line of FIG. 1B, the ion beam B is interrupted by the faraday cup 22b when the faraday cup 22b is disposed on the beam line. Meanwhile, as indicated by the solid line of FIG. 1B, the interruption of the ion beam B is cancelled when the faraday cup 22b is deviated from the beam line. Accordingly, the beam measurement unit 22 serves as an interruption member for the ion beam B.

The beam scanner 24 is configured to provide beam scanning and is a deflection member that performs scanning the shaped ion beam B in the x direction. The beam scanner 24 includes scanner electrodes 26 which are separated from each other in the x direction. The scanner electrodes 26 are connected to a variable voltage supply (not illustrated). Here, when the voltage applied to the scanner electrode 26 is changed, an electric field formed between the electrodes is changed so as to deflect the ion beam B. In this way, the ion beam B is scanned across an x-direction scanning range. In FIG. 1A, beam scanning and the scanning range thereof are denoted by arrow X as an example, and ion beams B at one end and the other end of the scanning range are respectively denoted by the one-dotted chain line.

The beam scanner 24 includes a beam damper 28 which is provided at the outside of an opening 24a through which the scanned ion beam B passes. The beam damper 28 is provided at the collision position of the ion beam B when the ion beam B is deflected over the scanning range of the x direction. The beam damper 28 is formed as a material such as graphite (C) which is not easily sputtered by the collision of the ion beam. In FIG. 1A, the dashed arrow B' indicates the ion beam route when the ion beam collides with the beam damper 28.

When the beam scanner 24 is operated so that the ion beam B collides with the beam damper 28, the ion beam B is deviated from the beam line, and is interrupted halfway. Accordingly, the beam scanner 24 also serves as the interruption member for the ion beam B. When the beam scanner 24 is operated so that the ion beam B is scanned in the normal scanning range, the interruption of the ion beam B is cancelled.

The parallel lens 30 is configured to cause the traveling direction of the scanned ion beam B to be parallel to each other. The parallel lens 30 includes a circular-arc P-lens electrode 32 having an ion beam passage slit at the center portion thereof. The P-lens electrode 32 is connected to a high-voltage power supply (not illustrated), and sets the traveling direction of the ion beam B in parallel by exerting the electric field generated by the application of the voltage to the ion beam B.

The angular energy filter 34 analyzes the energy of the ion beam B, deflects the ion of the necessary energy downward, and leads the ion to the implantation processing chamber 16. The angular energy filter 34 includes a magnetic field deflection magnet (not illustrated) and an electric field deflection AEF electrode 36. A high-voltage power supply (not illustrated) is connected to the AEF electrode 36. In FIG. 1B, a positive voltage is applied to the upper AEF electrode 36 and a negative voltage is applied to the lower AEF electrode 36, so that the ion beam B is deflected downward.

In this way, the beam line device 14 supplies the ion beam B to be irradiated to the substrate W to the implantation processing chamber 16. Furthermore, each of the scanner electrode 26, the P-lens electrode 32, and the AEF electrode 36 is one electrode which is configured to exert an electric field to the ion beam passing through the beam line and to which a high voltage is applied.

The implantation processing chamber 16 holds one or a plurality of substrates W and includes an object holding unit (not illustrated in the figure) configured to provide, for example, y-direction relative movement (so-called mechanical scanning) with respect to the ion beam B for the substrate W as is necessary. In FIG. 1, the mechanical scanning is denoted by arrows Y as an example. In addition, the implantation processing chamber 16 includes the beam stopper 38. In a case where the substrate W is not present on the ion beam B, the ion beam B is incident on the beam stopper 38.

The implantation processing chamber 16 is provided with a plasma shower device 40 which supplies electrons to the ion beam B. The plasma shower device 40 includes a plasma generation chamber 42, an antenna 44, and a gas introduction pipe 46. The plasma shower device 40 generates plasma P by applying a high frequency from the antenna 44 to a source gas which is introduced to the plasma generation chamber 42 through the gas introduction pipe 46. When the plasma P is generated, electrons in the plasma are drawn through a drawn opening 42a communicating with the implantation processing chamber 16, and the electrons are supplied to the implantation processing chamber 16.

The gas introduction pipe 46 is connected to a gas supply unit 50 through a mass flowmeter 48. The mass flowmeter 48 controls the flow rate of the source gas which is supplied from the gas supply unit 50 to the plasma generation chamber 42 through the gas introduction pipe 46. The mass flowmeter 48 is operated based on the control signal from the control unit 60.

The mass flowmeter 48 supplies a necessary amount of a source gas to the plasma generation chamber 42 in accordance with the operation state of the plasma shower device 40 when the plasma is ignited or the plasma is generated. Particularly, when the plasma is ignited, there is a need to increase the concentration of the source gas in the plasma generation chamber 42 compared to the case of generating and keeping the plasma. Therefore, the source gas starts to be supplied at a first flow rate as a comparatively large flow rate during an ignition start period in which the plasma starts to be generated, and the source gas starts to be supplied at a second flow rate smaller than the first flow rate after the plasma is generated. When the plasma is not generated, the supply of the source gas is stopped.

The control unit 60 controls the operations of the components of the ion implantation apparatus 10. The control unit 60 controls the generation of the plasma in the plasma shower device 40 by controlling the operation of the antenna 44 or the mass flowmeter 48. Further, the control unit 60 interrupts the ion beam B in the middle of the beam line by controlling the operation of the beam measurement unit 22 or the beam scanner 24 serving as the interruption member for the ion beam B.

The control unit 60 halfway interrupts the ion beam B by operating the interruption member when the plasma P starts to be generated by the activation of the plasma shower device 40. The control unit 60 instantly introduces the source gas for igniting the plasma into the plasma generation chamber 42 after the ion beam B is interrupted. That is, the ion beam is interrupted before the vacuum degree is degraded in the vicinity of the downstream side close to the implantation processing chamber 16 in the beam line device 14. Thus, it is possible to prevent a load current from being generated when the charged particles generated by the ionization of the ion beam B colliding with the high-concentration source gas existing in the vicinity of the downstream side of the beam line device 14 flow to the electrode. The electrode state at this time will be described with reference to FIGS. 2A to 3B.

FIGS. 2A and 2B are schematic views illustrating an electrode state according to a comparative example, and illustrate an electrode state in the case where the ion beam B is not interrupted when the source gas starts to be introduced. FIG. 2A illustrates P-lens electrodes 32a to 32d of the parallel lens 30, and illustrates the first P-lens electrodes 32a and 32b to which a positive voltage is applied and the second P-lens electrodes 32c and 32d to which a negative voltage is applied. FIG. 2B illustrates AEF electrodes 36a and 36b of the angular energy filter 34, and illustrates the first AEF electrode 36a to which a positive voltage is applied and the second AEF electrode 36b to which a negative voltage is applied. Furthermore, the voltage applied to the P-lens electrodes 32a to 32d and the AEF electrodes 36a and 36b illustrated in the drawings is an example. Here, the positive and negative voltages applied herein may be inverted, and the ground potential may be applied thereto. Furthermore, the same applies to FIGS. 3A to 4B.

FIGS. 2A and 2B illustrate a state where gas molecules 70 which are introduced for igniting the plasma flow from the plasma generation chamber 42 into the beam line device 14 through the implantation processing chamber 16, and illustrate a state where the vacuum degree in the vicinity of the electrode is degraded due to the existence of many gas molecules 70. When the ion beam B passes through many gas molecules 70, the gas molecules 70 are ionized by the collision with the ion beam B, so that ions 72 and electrons 74 are generated. The positively charged ions 72 flow to the second P-lens electrodes 32c and 32d or the second AEF electrode 36b charged negatively. Meanwhile, the negatively charged electrons 74 flow to the first P-lens electrodes 32a and 32b or the first AEF electrode 36a charged positively. Thus, the load current flows to the P-lens electrodes 32a to 32d or the AEF electrodes 36a and 36b, and hence there is a concern that an overcurrent may generated in the power supply connected to the electrodes.

Figure 3A:
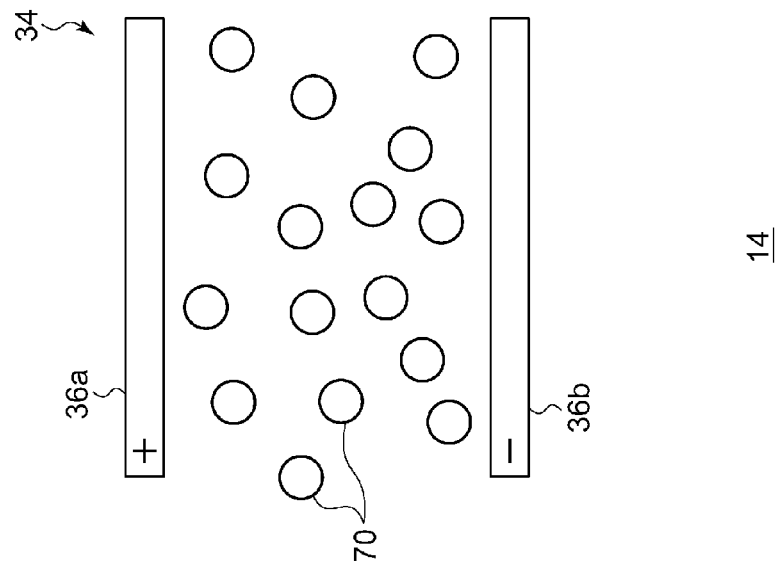
FIGS. 3A and 3B are schematic views illustrating an electrode state according to the embodiment.
Figure 3B:
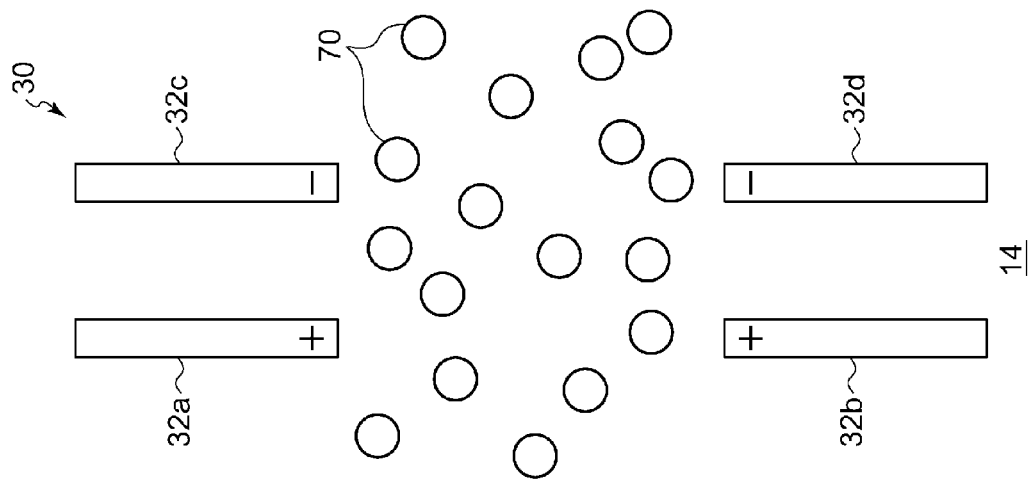

FIGS. 3A and 3B are schematic views illustrating an electrode state according to the embodiment, and illustrate an electrode state in the case where the ion beam B is interrupted at the upstream side when the source gas starts to be introduced. Similarly to the comparative example, the vacuum degree is degraded in the vicinity of the electrode due to the gas molecules 70 which are introduced for igniting the plasma. However, in the embodiment, the ion beam is interrupted by the interruption member such as the beam measurement unit 22 or the beam scanner 24 provided at the upstream side of the parallel lens 30 or the angular energy filter 34. Accordingly, it is possible to suppress the charged particles from being generated by the ionization of the gas molecules 70 even when many gas molecules 70 exist in the vicinity of the electrode. Thus, it is possible to protect the power supply connected to the electrode by suppressing the load current flowing to the electrode.

Subsequently, the control unit 60 cancels the interruption of the ion beam B at the time point in which the plasma P is generated and the vacuum degree of the beam line device 14 is recovered. First, the control unit 60 decreases the supply of the source gas to the plasma generation chamber 42 to the second flow rate when the plasma P is generated. The time until the generation of the plasma is checked is approximately shorter than 1 second.

The control unit 60 cancels the interruption of the ion beam B after a predetermined time elapses from the timing in which the supply of the source gas is switched to the second flow rate. This is because a large amount of the source gas introduced during the plasma ignition start period by the vacuum discharge system is discharged immediately after the selection of the second flow rate as a small flow rate is discharged, the gas concentration decreases, and the vacuum degree is recovered. The time necessary for the recovery of the vacuum degree depends on the source gas supply amount or the processing ability of the vacuum discharge system, but is, for example, about 10 seconds to 60 seconds. Specifically, the time is about 20 seconds. Furthermore, the control unit 60 may measure the value of a vacuum meter (not illustrated) provided in the beam line device 14, and may cancel the interruption of the ion beam B by determining that the vacuum degree is recovered when the value becomes a predetermined threshold value or less.

FIGS. 4A and 4B are schematic views illustrating an electrode state in a high vacuum state, and illustrate a state where the interruption of the ion beam B is cancelled by the recovery of the vacuum degree after the activation of the plasma shower device 40. In this state, since the gas molecules 70 substantially do not exist in the vicinity of the electrode, the ion beam B does not easily collide with the gas molecules 70. Even when the gas molecules 70 are ionized by the collision, the amount of the generated charged particles is extremely small, and hence the amount of the load current flowing to the electrode is small. In this way, when the interruption of the ion beam B is recovered after the recovery of the vacuum degree, it is possible to protect the power supply that applies a high voltage to the electrode by preventing the generation of the load current.

Figure 5:
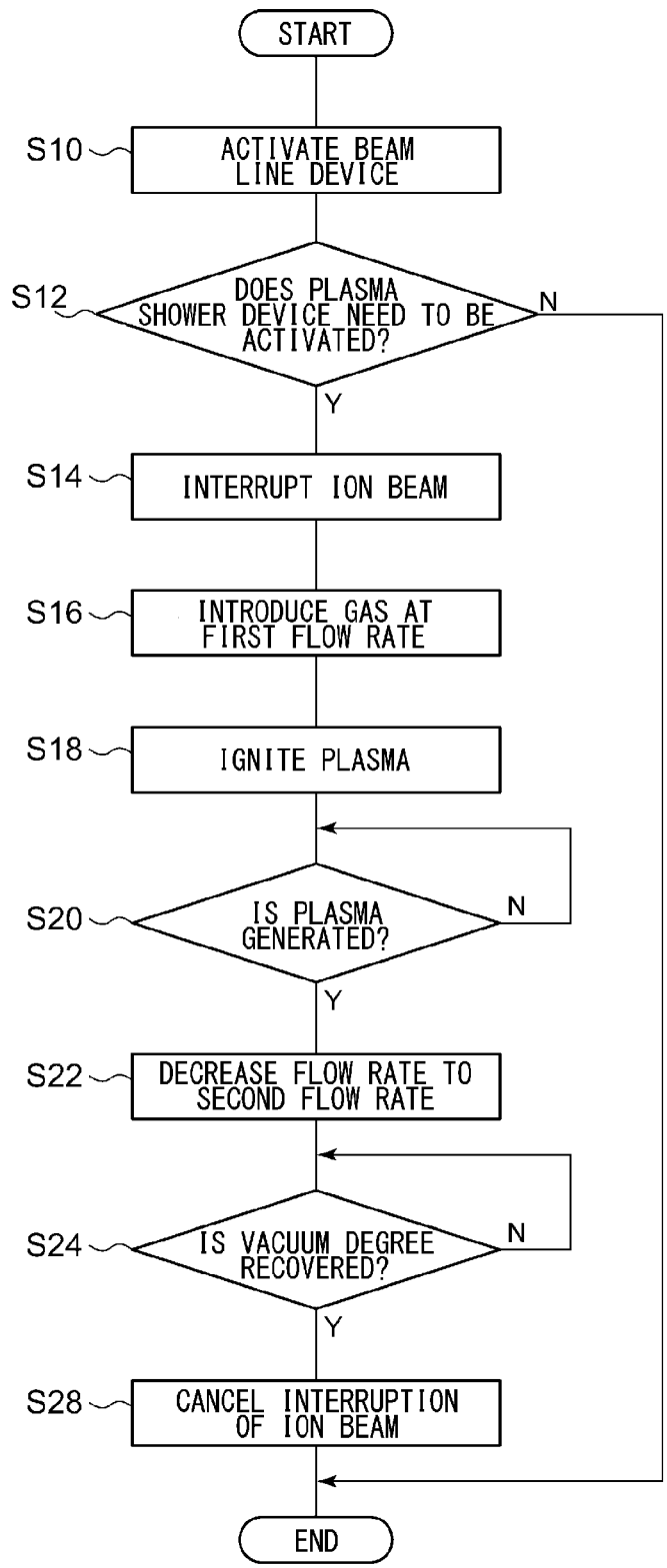
FIG. 5 is a flowchart illustrating an operation sequence of the ion implantation apparatus according to the embodiment.

Subsequently, the operation of the control unit 60 when the plasma shower device 40 is activated will be described. FIG. 5 is a flowchart illustrating an operation sequence of the ion implantation apparatus 10. After the beam line device 14 is activated (S10), when there is a need to activate the plasma shower device 40 (Y of S12), the interruption member is operated so as to interrupt the ion beam in the middle of the beam line (S16). After the ion beam is interrupted, the source gas starts to be introduced into the plasma generation chamber 42 at the first flow rate (S16), and a high frequency is applied to the antenna 44 so as to ignite the plasma (S18).

When the plasma is generated by the plasma generation chamber 42 (Y of S20), the flow rate of the source gas introduced into the plasma generation chamber 42 is decreased to the second flow rate (S22). Subsequently, when the vacuum degree of the beam line device 14 is recovered to a desired value (Y of S24), the interruption of the ion beam is cancelled (S28). When the plasma is not generated yet in S20 (N of S20), the routine remains in a standby state until the generation of the plasma. When the vacuum degree is not recovered yet in S24 (N of S24), the routine remains in a standby state until the recovery of the vacuum degree. Further, when there is no need to activate the plasma shower device 40 (N of S12), the processes from S14 to S28 are skipped.

With the above-described operation, the ion implantation apparatus 10 may suppress the generation of the charged particles in the vicinity of the electrode of the beam line device 14 by halfway interrupting the ion beam during the plasma ignition start period even when the beam line device 14 and the plasma shower device 40 are activated together. Further, even when the ion beam is directly changed from the ion implantation condition that does not need the plasma shower to the ion implantation condition that needs the plasma shower, it is possible to suppress the generation of the charged particles in the vicinity of the electrodes by interrupting the ion beam during the plasma ignition start period. As a result, the beam line device 14 and the plasma shower device 40 may be activated together, and hence the time necessary for the start-up of the ion implantation apparatus 10 may be shortened. Particularly, since the interruption member such as the beam measurement unit 22 or the beam scanner 24 may rapidly interrupt the beam line, the time lag caused by the start-up of the plasma shower device 40 may be shortened. Thus, the productivity of the ion implantation processing may be improved by improving the production rate of the ion implantation apparatus 10.

Figure 6:
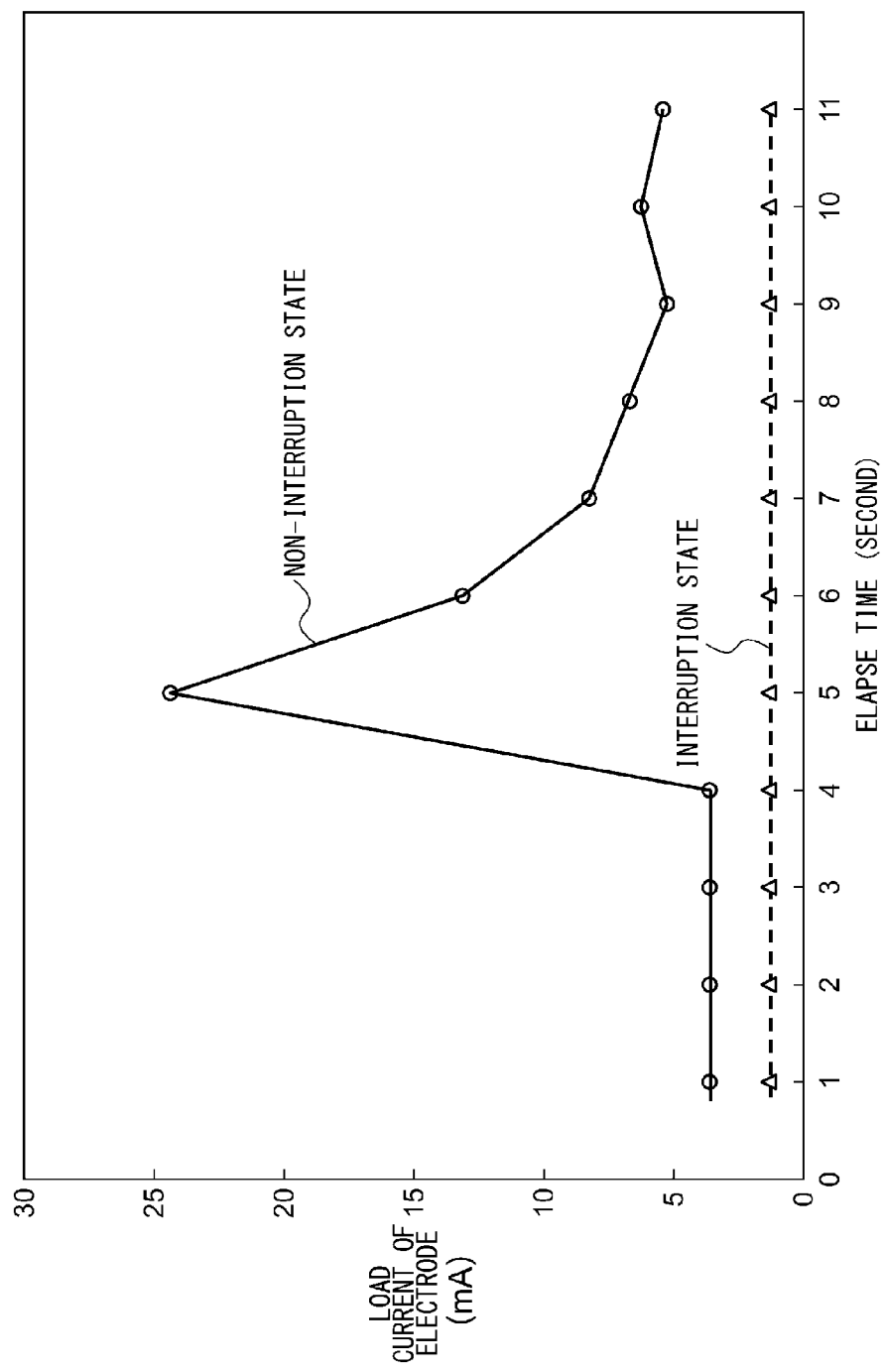
FIG. 6 is a graph illustrating a load current suppression effect due to the interruption of an ion beam.

FIG. 6 is a graph illustrating a load current suppression effect obtained by the interruption of the ion beam. This drawing illustrates the transition of the load current of the electrode after the source gas starts to be introduced into the plasma generation chamber 42 by the activation of the plasma shower device 40. In the case of the "non-interruption" of the ion beam, the load current increases when the vacuum degree in the beam line device 14 is degraded after a certain time elapses from the start of the introduction of the source gas. Meanwhile, in the case of the "interruption" of the ion beam, the load current does not change even when the vacuum degree is degraded due to the start of the introduction of the source gas. In this way, it is understood that the generation of the load current is suppressed by the interruption of the ion beam when the source gas starts to be introduced.

Described above is an explanation based on the exemplary embodiments of the present invention. The invention is not limited to the above-mentioned embodiments, and various design modifications may be added. It will be obvious to those skilled in the art that such modifications are also within the scope of the present invention.

In the above-described embodiment, a case has been described in which the beam measurement unit 22 or the beam scanner 24 is used as the interruption member. In the modified example, the mass spectrometry unit 18 or the beam shaping unit 20 which is provided at the upstream side of the beam measurement unit 22 may be used as the interruption member. Since the mass spectrometry unit 18 or the beam shaping unit 20 serves as the deflection member that deflects the ion beam similarly to the beam scanner 24, the mass spectrometry unit 18 or the beam shaping unit 20 may serve as the interruption member that deflects the ion beam so that the ion beam is deviated from the beam line. The same effect as the above-described embodiment may be obtained by interrupting the ion beam at the upstream side of the beam line.

In the above-described embodiment, the source gas starts to be introduced into the plasma generation chamber after the ion beam is interrupted. In the modified example, the ion beam may be interrupted immediately after the source gas starts to be introduced. The time is, for example, within 5 seconds, and is appropriately within 3 seconds. Since there is a slight difference in time until the source gas introduced into the plasma generation chamber enters the beam line device 14, the ion beam may be interrupted before the vacuum degree of the beam line device 14 is degraded. Even when there is a difference in interruption timing, the same effect as the above-described embodiment may be obtained by interrupting the ion beam before the vacuum degree of the beam line device 14 is degraded.

It should be understood that the invention is not limited to the above-described embodiment, but may be modified into various forms on the basis of the spirit of the invention. Additionally, the modifications are included in the scope of the invention.

Priority is claimed to Japanese Patent Application No. 2014-014584, filed on Jan. 29, 2014, the entire content of which is incorporated herein by reference.

What is claimed is:

1. An ion implantation apparatus comprising:
   an interruption member that interrupts an ion beam in the middle of a beam line;
   a plasma shower device that is provided at the downstream side of the interruption member in the beam line; and
   a control unit that causes the interruption member to interrupt the ion beam during an ignition start period of the plasma shower device such that the ion beam is interrupted before a vacuum degree is degraded in the vicinity of the plasma shower device.

2. The ion implantation apparatus according to claim 1, further comprising:
   at least one high-voltage electric field type electrode,
   wherein the interruption member is provided at the upstream side of the electrode in the beam line.

3. The ion implantation apparatus according to claim 1, further comprising:
   a gas supply unit that supplies a source gas to the plasma shower device,
   wherein the control unit starts the supply of the source gas from the gas supply unit after the ion beam is interrupted by the interruption member.

4. The ion implantation apparatus according to claim 3, wherein, after the gas supply unit starts to supply the source gas at a first flow rate, the control unit continues the supply of the source gas from the gas supply unit at a second flow rate smaller than the first flow rate.

5. The ion implantation apparatus according to claim 1, wherein the control unit cancels the interruption of the ion beam by the interruption member after a predetermined time which is necessary to decrease the high gas concentration of the beam line caused by the introduction of the source gas.

6. The ion implantation apparatus according to claim 1, further comprising:
   a beam measurement unit that is disposed so as to move into and out of the beam line and measures the current of the ion beam,
   wherein the control unit operates the beam measurement unit as the interruption member by inserting the beam measurement unit into the beam line.

7. The ion implantation apparatus according to claim 1, further comprising:
   a deflection member that changes the traveling direction of the ion beam,
   wherein the control unit operates the deflection member as the interruption member by operating the deflection member so that the ion beam is deviated from the beam line.

8. A method of controlling an ion implantation apparatus, the ion implantation apparatus forming a beam line carrying an ion beam drawn out from an ion source to an implantation processing chamber,
   wherein the ion implantation apparatus includes a plasma shower device that supplies electrons to the ion beam in the implantation processing chamber, and
   wherein the plasma shower device includes a plasma generation chamber that communicates with the implantation processing chamber, and generates plasma by using a source gas introduced into the plasma generation chamber,
   the method comprising:
   interrupting the ion beam in the middle of the beam line when the plasma shower device starts to generate the plasma such that the ion beam is interrupted before a vacuum degree is degraded in the vicinity of the plasma shower device.

9. The method of controlling the ion implantation apparatus according to claim 8,
   wherein the ion implantation apparatus includes at least one electrode that exerts an electric field to the ion beam passing through the beam line, and
   wherein the ion beam is interrupted at the upstream side of the beam line close to the ion source in relation to at least one electrode.

10. The method of controlling the ion implantation apparatus according to claim 8, further comprising:
    starting the supply of the source gas to the plasma generation chamber after interrupting the ion beam.

11. The method of controlling the ion implantation apparatus according to claim 10, further comprising:
    continuing the supply of the source gas, after starting the supply of the source gas to the plasma generation chamber at a first flow rate, at a second flow rate smaller than the first flow rate.

12. The method of controlling the ion implantation apparatus according to claim 8,
    wherein interrupting the ion beam is cancelled after a predetermined time which is necessary to decrease the high gas concentration in the beam line caused by the introduction of the source gas.

* * * * *